(12) United States Patent
Imamura et al.

(10) Patent No.: US 10,144,033 B2
(45) Date of Patent: Dec. 4, 2018

(54) SUBSTRATE PROCESSING APPARATUS AND SUBSTRATE PROCESSING METHOD

(71) Applicant: SCREEN HOLDINGS CO., LTD., Kyoto (JP)

(72) Inventors: Masanori Imamura, Kyoto (JP); Masashi Kanaoka, Kyoto (JP); Hidetoshi Sagawa, Kyoto (JP); Yoshinori Tawaratani, Kyoto (JP); Masaaki Furukawa, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 129 days.

(21) Appl. No.: 15/251,658

(22) Filed: Aug. 30, 2016

(65) Prior Publication Data
US 2017/0056917 A1     Mar. 2, 2017

(30) Foreign Application Priority Data
Sep. 1, 2015 (JP) ................................. 2015-171919

(51) Int. Cl.
| | |
|---|---|
| *B05D 3/12* | (2006.01) |
| *B05D 1/00* | (2006.01) |
| *B05D 3/10* | (2006.01) |
| *H01L 21/67* | (2006.01) |
| *H01L 51/00* | (2006.01) |

(52) U.S. Cl.
CPC ............. *B05D 1/005* (2013.01); *B05D 3/107* (2013.01); *H01L 21/6715* (2013.01); *H01L 21/67253* (2013.01); *H01L 51/001* (2013.01)

(58) Field of Classification Search
CPC ..... B05D 1/005; B05D 3/107; H01L 21/6715; H01L 21/67253

USPC ......................................................... 427/240
See application file for complete search history.

(56) References Cited

U.S. PATENT DOCUMENTS

| | | | |
|---|---|---|---|
| 2002/0124798 A1 | 9/2002 | Kitano et al. | ................. 118/300 |
| 2004/0094089 A1 | 5/2004 | Kitano et al. | ................. 118/683 |
| 2006/0073703 A1* | 4/2006 | Li | ..................... H01L 21/02087 |
| | | | 438/689 |
| 2011/0135820 A1 | 6/2011 | Imamura et al. | ............. 427/240 |

(Continued)

FOREIGN PATENT DOCUMENTS

| | | |
|---|---|---|
| JP | 09-106980 A | 4/1997 |
| JP | 2011-119597 | 6/2011 |

(Continued)

OTHER PUBLICATIONS

Decision to Grant a Patent dated Apr. 5, 2017 in the corresponding Korean Patent Application No. 10-2016-0110698.

(Continued)

*Primary Examiner* — Kirsten Jolley
(74) *Attorney, Agent, or Firm* — Ostrolenk Faber LLP (57) ABSTRACT

A substrate is held and rotated in a horizontal attitude by a rotation holder. A coating liquid is supplied by a coating liquid supplier to a surface to be processed of the substrate rotated by the rotation holder. A first removal liquid is supplied by a first removal liquid supplier to a first annular region at a peripheral portion of the substrate rotated by the rotation holder before the coating liquid supplied by the coating liquid supplier loses fluidity. In this state, a supply position of the first removal liquid by the first removal liquid supplier is moved from an inner edge to an outer edge of the first annular region.

6 Claims, 7 Drawing Sheets

(56) References Cited

U.S. PATENT DOCUMENTS

| | | | |
|---|---|---|---|
| 2014/0124479 A1* | 5/2014 | Tomita | H01L 21/02087 |
| | | | 216/85 |
| 2016/0167079 A1* | 6/2016 | Hasimoto | G05B 15/02 |
| | | | 700/283 |
| 2018/0021804 A1* | 1/2018 | Hashimoto | B05D 1/005 |

FOREIGN PATENT DOCUMENTS

| | | |
|---|---|---|
| JP | 2014-093371 | 5/2014 |
| KR | 10-0755799 | 8/2007 |
| KR | 10-2011-0065314 A | 6/2011 |

OTHER PUBLICATIONS

Hun Lee, et al., "A new fabrication process for uniform SU-8 thick photoresist structures by simultaneously removing edge bead and air bubbles", J. Micromech. Mircoeng. 21 (2011), 125006; Nov. 3, 2011, pp. 1-8.

Office Action dated Nov. 22, 2016 in the counterpart Korean Patent Application No. 10-2016-0110698.

* cited by examiner

SUBSTRATE PROCESSING APPARATUS AND SUBSTRATE PROCESSING METHOD

BACKGROUND OF THE INVENTION

Field of the Invention

The present invention relates to a substrate processing apparatus and a substrate processing method for forming a film of a coating liquid on a substrate.

Description of Related Art

In a lithography process in semiconductor manufacturing, a coating liquid such as a resist liquid is applied to a substrate by a substrate processing apparatus in order to form a pattern on the substrate by exposure processing. In recent years, devices having three-dimensional structure have been developed due to an increase in integration of semiconductor circuits. In order to manufacture such devices, a coating liquid having high viscosity is applied to the substrate such that a coating film having a film thickness larger than a conventional coating film is formed.

A resist coating device described in JP 2014-93371 A includes a spin chuck, a solvent nozzle and a resist nozzle. A solvent is discharged at a center portion of a wafer from the solvent nozzle while the wafer is held horizontally by the spin chuck and rotated at a first rotation speed about a rotation shaft extending vertically. Next, the solvent is discharged at the center portion of the wafer from the solvent nozzle while a rotation speed of the wafer decreases to a second rotation speed that is smaller than the first rotation speed. Thereafter, a resist liquid is discharged at the center portion of the wafer from the resist nozzle, so that spin coating of the resist liquid is performed.

BRIEF SUMMARY OF THE INVENTION

In JP 2014-93371 A, it is described that, when a coating film is formed by a coating liquid having high viscosity by the above-mentioned coating method on the substrate on which concave patterns are formed at the surface, the coating liquid spreads to the inside of the concave patterns, and the good coating film is acquired. However, in the case where viscosity of the coating liquid is high, the coating liquid is difficult to spread on the substrate in the conventional spin coating utilizing a centrifugal force such as the spin coating described in JP 2014-93371 A. Therefore, unless a large amount of the coating liquid is used, non-uniform radial application or missing application occurs on the substrate, and the thickness of the coating film becomes non-uniform.

On the one hand, when the substrate processing is performed using a large amount of the coating liquid, a cost of the substrate processing increases. In this manner, in the case where the viscosity of the coating liquid is high, it is difficult to reduce an amount of the coating liquid to be used with no occurrence of the above-mentioned non-uniform application, missing application and non-uniform thickness of the film.

An object of the present invention is to provide a substrate processing apparatus and a substrate processing method capable of reducing an amount of a coating liquid to be used with no occurrence of non-uniform application, missing application and non-uniform thickness of a film.

(1) A substrate processing apparatus according to one aspect of the present invention that forms a film of a coating liquid on a substrate includes a rotation holder that holds and rotates the substrate in a horizontal attitude, a coating liquid supplier configured to supply the coating liquid to one surface of the substrate, a first removal liquid supplier configured to supply a first removal liquid that removes the coating liquid to a peripheral portion of the one surface of the substrate, and a controller that controls operations of the coating liquid supplier and the first removal liquid supplier, wherein the controller controls the coating liquid supplier to supply the coating liquid to the one surface of the substrate rotated by the rotation holder, and controls the first removal liquid supplier to supply the first removal liquid to a first annular region at the peripheral portion of the substrate rotated by the rotation holder, and controls the first removal liquid supplier such that a supply position of the first removal liquid is moved from an inner edge to an outer edge of the first annular region, before the coating liquid supplied by the coating liquid supplier loses fluidity.

In this substrate processing apparatus, the substrate is held and rotated in a horizontal attitude by the rotation holder. The coating liquid is supplied by the coating liquid supplier to the one surface of the substrate rotated by the rotation holder. Before the coating liquid supplied by the coating liquid supplier loses fluidity, the first removal liquid is supplied by the first removal liquid supplier to the first annular region at the peripheral portion of the substrate rotated by the rotation holder. In this state, the supply position of the first removal liquid by the first removal liquid supplier is moved from the inner edge to the outer edge of the first annular region.

In the case where the viscosity of the coating liquid is high, the thickness of the coating liquid at the center portion of the substrate increases the most, and the thickness of the coating liquid at the peripheral portion of the substrate slightly increases. On the one hand, the thickness of the coating liquid of a portion between the center portion and the peripheral portion of the substrate decreases. When the supply amount of the coating liquid decreases, this tendency increases.

Even in such a case, in the above-mentioned configuration, the first removal liquid is supplied from the inner edge to the outer edge of the first annular region before the coating liquid loses fluidity. In this case, the coating liquid supplied from the inner edge to the outer edge of the first annular region is removed, and drying proceeds while the coating liquid accumulated at the center portion of the substrate is led to the peripheral portion. Thus, the thickness of the coating liquid at the center portion of the substrate decreases, and the thickness of the coating liquid at the peripheral portion of the substrate increases. Therefore, the thickness of the coating liquid can be made close to being uniform. As a result, an amount of the coating liquid to be used can be reduced with no occurrence of non-uniform application, missing application and non-uniform thickness of the film.

(2) The controller may control the first removal liquid supplier such that the supply position of the first removal liquid is moved from the inner edge to the outer edge of the first annular region after the supply position of the first removal liquid is moved from the outer edge to the inner edge of the first annular region.

Because fluidity of the coating liquid is maintained in the case of the start of supply of the first removal liquid by the first removal liquid supplier, when the supply position in the case of start of supply of the first removal liquid is at the inner edge of the first annular region, an amount of splash of the first removal liquid from the substrate increases. The above-mentioned configuration causes an amount of splash of the first removal liquid to be reduced more sufficiently than the case where the supply position in the case of the start of supply of the first removal liquid is at the inner edge of the first annular region. Thus, contamination of the first removal liquid supplier due to splash of the first removal liquid can be reduced.

(3) The controller may control the first removal liquid supplier such that a moving speed of the supply position of the first removal liquid from the outer edge towards the inner edge of the first annular region is larger than a moving speed of the supply position of the first removal liquid from the inner edge towards the outer edge of the first annular region.

In this case, the supply position of the first removal liquid is moved to the inner edge of the first annular region in a short period of time. Thus, the coating liquid supplied from the inner edge to the outer edge of the first annular region is sufficiently removed before the coating liquid loses fluidity. Further, because the supply position of the first removal liquid is moved at a low speed from the inner edge to the outer edge of the first annular region, the coating liquid accumulated at the center portion of the substrate is sufficiently led to the peripheral portion without exceeding the diffusion speed of the coating liquid. As a result, the thickness of the coating liquid can be efficiently made close to being uniform.

(4) The controller may control the coating liquid supplier and the first removal liquid supplier such that a period during which the coating liquid is supplied to the one surface of the substrate by the coating liquid supplier and a period during which the first removal liquid is supplied to the first annular region at the peripheral portion of the substrate by the first removal liquid supplier partially overlap with each other.

In this case, the first removal liquid is supplied by the first removal liquid supplier before supply of the coating liquid by the coating liquid supplier is stopped. Thus, the coating liquid supplied from the inner edge to the outer edge of the first annular region is sufficiently removed before the coating liquid loses fluidity. Thereafter, the coating liquid accumulated at the center portion of the substrate is sufficiently led to the peripheral portion, whereby the thickness of the coating liquid can be efficiently made close to being uniform.

(5) The first removal liquid supplier may supply the first removal liquid to the first annular region while discharging the first removal liquid obliquely downward and outward.

Because fluidity of the coating liquid is maintained in the case of the start of supply of the first removal liquid by the first removal liquid supplier, when the first removal liquid is discharged directly downward, an amount of splash of the first removal liquid from the substrate increases. The above-mentioned configuration causes an amount of splash of the first removal liquid to be reduced more sufficiently than the case where the first removal liquid is discharged directly downward. Thus, contamination of the first removal liquid supplier due to splash of the first removal liquid can be reduced.

(6) The substrate processing apparatus may further include a second removal liquid supplier configured to supply a second removal liquid that removes the coating liquid to the peripheral portion of the one surface of the substrate, wherein the controller may control the second removal liquid supplier to supply the second removal liquid to a second annular region at the peripheral portion of the substrate rotated by the rotation holder after the coating liquid supplied by the coating liquid supplier loses fluidity, and an inner edge of the second annular region may be located at a position further outward than the inner edge of the first annular region.

In this case, a film of the coating liquid is not formed in the second annular region at the peripheral portion of the substrate. Thus, even in the case where a transport mechanism that transports the substrate holds the peripheral portion of the substrate, the film of the coating liquid is prevented from being stripped and becoming particles. Further, because the inner edge of the second annular region is located at a position further outward than the inner edge of the first annular region, a formation region of the film of the coating liquid on the substrate is hardly reduced. Thus, a region of the substrate that can be utilized for fabrication of a product can be increased.

(7) The first and second removal liquid suppliers may be constituted by a common removal liquid supplier. In this case, it is not necessary to provide the first removal liquid supplier and the second removal liquid supplier separately. Thus, the substrate processing apparatus can be made compact.

(8) The first and second removal liquids may be a same removal liquid. In this case, it is not necessary to prepare different types of removal liquids for the first removal liquid and the second removal liquid. Thus, a cost of the substrate processing apparatus can be reduced.

(9) The substrate processing apparatus may further include a cleaner that cleans a supply portion of the first removal liquid in the first removal liquid supplier.

Because fluidity of the coating liquid is maintained in the case of the start of supply of the first removal liquid by the first removal liquid supplier, the first removal liquid supplier is easy to be contaminated by splash of the first removal liquid from the substrate. In the above-mentioned configuration, the supply portion of the first removal liquid in the first removal liquid supplier is cleaned by the cleaner. Thus, the first removal liquid supplier can be maintained clean.

(10) The substrate processing apparatus may further include a solvent supplier configured to supply a solvent to the one surface of the substrate, wherein the controller may control the solvent supplier to supply the solvent to the one surface of the substrate rotated by the rotation holder before the coating liquid is supplied to the one surface of the substrate by the coating liquid supplier.

In this case, when the coating liquid is supplied to the one surface of the substrate by the coating liquid supplier, the coating liquid is easy to diffuse on the one surface of the substrate. Thus, a film of the coating liquid can be formed on the substrate using a smaller amount of the coating liquid.

(11) A substrate processing method according to another aspect of the present invention for forming a film of a coating liquid on a substrate includes the steps of holding and rotating the substrate in a horizontal attitude by a rotation holder, supplying the coating liquid by a coating liquid supplier to one surface of the substrate rotated by the rotation holder, and supplying a first removal liquid by a first removal liquid supplier to a first annular region at a peripheral portion of the substrate rotated by the rotation holder and moving a supply position of the first removal liquid by the first removal liquid supplier from an inner edge to an outer edge of the first annular region, before the coating liquid supplied by the coating liquid supplier loses fluidity.

In this substrate processing method, the substrate is held and rotated in a horizontal attitude by the rotation holder. The coating liquid is supplied by the coating liquid supplier to the one surface of the substrate rotated by the rotation holder. Before the coating liquid supplied by the coating liquid supplier loses fluidity, the first removal liquid is supplied by the first removal liquid supplier to the first annular region at the peripheral portion of the substrate rotated by the rotation holder. In this state, the supply position of the first removal liquid by the first removal liquid supplier is moved from the inner edge to the outer edge of the first annular region.

In the case where viscosity of the coating liquid is high, the thickness of the coating liquid at the center portion of the substrate increases the most, and the thickness of the coating liquid at the peripheral portion of the substrate slightly increases. On the one hand, the thickness of the coating liquid of the portion between the center portion and the peripheral portion of the substrate decreases. When a supply amount of the coating liquid decreases, this tendency increases.

Even in such a case, in the above-mentioned method, the first removal liquid is supplied from the inner edge to the outer edge of the first annular region before the coating liquid loses fluidity. In this case, the coating liquid supplied from the inner edge to the outer edge of the first annular region is removed, and drying proceeds while the coating liquid accumulated at the center portion of the substrate is led to the peripheral portion. Thus, the thickness of the coating liquid at the center portion of the substrate decreases, and the thickness of the coating liquid at the peripheral portion of the substrate increases. Therefore, the thickness of the coating liquid can be made close to being uniform. As a result, an amount of the coating liquid to be used can be reduced with no occurrence of non-uniform application, missing application and non-uniform thickness of the film.

(12) The step of moving the supply position of the first removal liquid may include moving the supply position of the first removal liquid by the first removal liquid supplier from the inner edge to the outer edge of the first annular region after moving the supply position of the first removal liquid by the first removal liquid supplier from the outer edge to the inner edge of the first annular region.

Because fluidity of the coating liquid is maintained in the case of the start of supply of the first removal liquid by the first removal liquid supplier, when the supply position in the case of the start of supply of the first removal liquid is at the inner edge of the first annular region, an amount of splash of the first removal liquid from the substrate increases. The above-mentioned method causes an amount of splash of the first removal liquid to be reduced more sufficiently than the case where the supply position in the case of the start of supply of the first removal liquid is at the inner edge of the first annular region. Thus, contamination of the first removal liquid supplier due to splash of the first removal liquid can be reduced.

(13) A moving speed of the supply position of the first removal liquid from the outer edge towards the inner edge of the first annular region may be larger than a moving speed of the supply position of the first removal liquid from the inner edge towards the outer edge of the first annular region.

In this case, the supply position of the first removal liquid is moved to the inner edge of the first annular region in a short period of time. Thus, the coating liquid supplied from the inner edge to the outer edge of the first annular region is sufficiently removed before the coating liquid loses fluidity. Further, because the supply position of the first removal liquid is moved at a low speed from the inner edge to the outer edge of the first annular region, the coating liquid accumulated at the center portion of the substrate is sufficiently led to the peripheral portion without exceeding the diffusion speed of the coating liquid. As a result, the thickness of the coating liquid can be efficiently made close to being uniform.

(14) A period during which the coating liquid is supplied to the one surface of the substrate by the coating liquid supplier and a period during which the first removal liquid is supplied to the first annular region at the peripheral portion of the substrate by the first removal liquid supplier may partially overlap with each other.

In this case, the first removal liquid is supplied by the first removal liquid supplier before supply of the coating liquid by the coating liquid supplier is stopped. Thus, the coating liquid supplied from the inner edge to the outer edge of the first annular region is sufficiently removed before the coating liquid loses fluidity. Thereafter, the coating liquid accumulated at the center portion of the substrate is sufficiently led to the peripheral portion, whereby the thickness of the coating liquid can be efficiently made close to being uniform.

(15) The step of supplying the first removal liquid may include supplying the first removal liquid to the first annular region while discharging the first removal liquid obliquely downward and outward by the first removal liquid supplier.

Because fluidity of the coating liquid is maintained in the case of the start of supply of the first removal liquid by the first removal liquid supplier, when the first removal liquid is discharged directly downward, an amount of splash of the first removal liquid from the substrate increases. The above-mentioned method causes an amount of splash of the first removal liquid to be reduced more sufficiently than the case where the first removal liquid is discharged directly downward. Thus, contamination of the first removal liquid supplier due to splash of the first removal liquid can be reduced.

(16) The method may further include the step of supplying a second removal liquid by a second removal liquid supplier to a second annular region at the peripheral portion of the substrate rotated by the rotation holder after the coating liquid supplied by the coating liquid supplier loses fluidity, wherein an inner edge of the second annular region may be located at a position further outward than the inner edge of the first annular region.

In this case, a film of the coating liquid is not formed in the second annular region at the peripheral portion of the substrate. Thus, even in the case where the transport robot that transports the substrate holds the peripheral portion of the substrate, a film of the coating liquid is prevented from being stripped and becoming particles. Further, because the inner edge of the second annular region is located at a position further outward than the inner edge of the first annular region, a formation region of the film of the coating liquid on the substrate is hardly reduced. Thus, a region of the substrate that can be utilized for fabrication of a product can be increased.

Other features, elements, characteristics, and advantages of the present invention will become more apparent from the following description of preferred embodiments of the present invention with reference to the attached drawings.

DESCRIPTION OF THE PREFERRED EMBODIMENTS

A substrate processing apparatus and a substrate processing method according to one embodiment of the present invention will be described below with reference to drawings. In the present embodiment, a resist liquid is used as a coating liquid.

(1) Substrate Processing Apparatus

Figure 1:
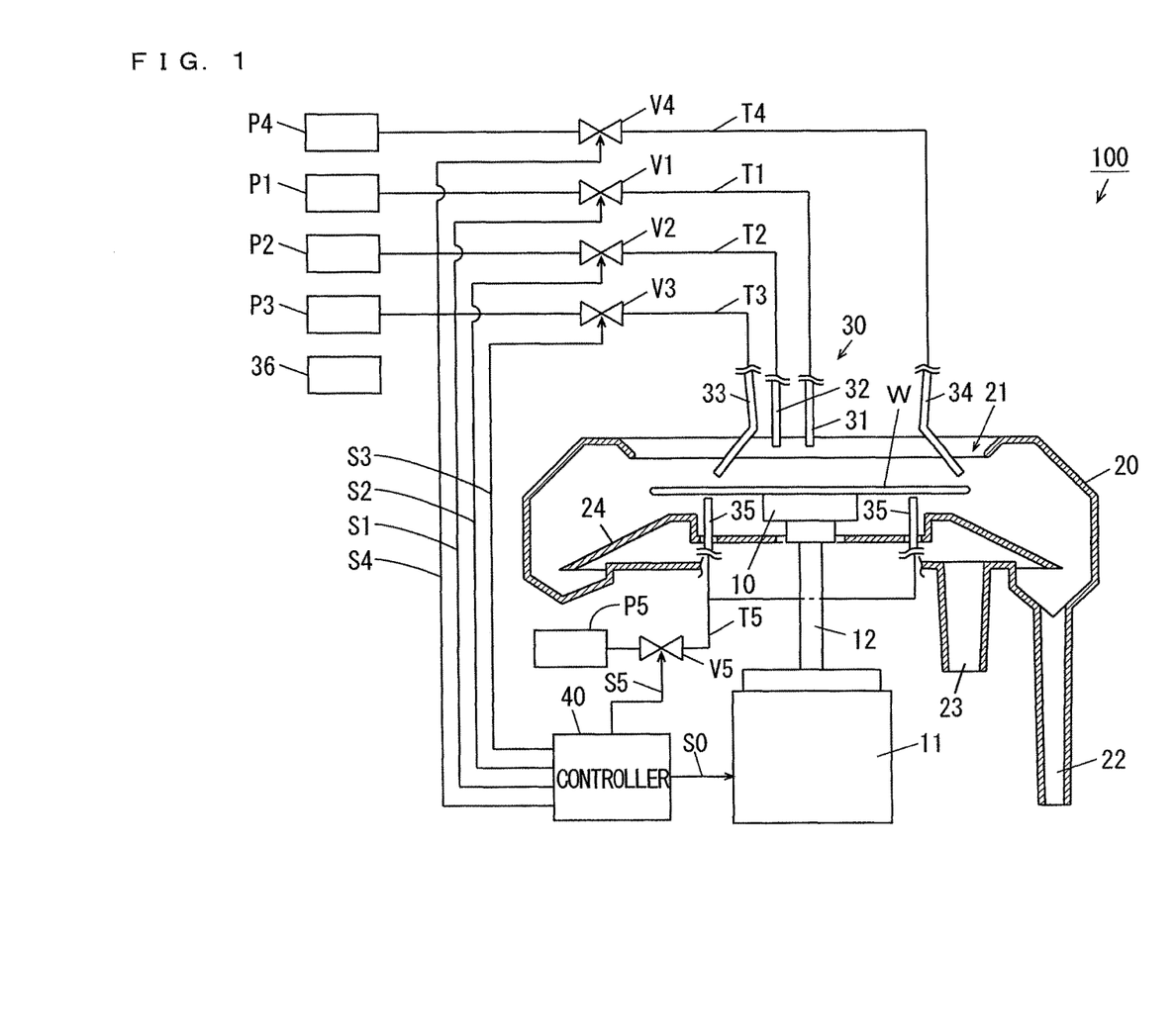
FIG. 1 is a schematic cross sectional view of a substrate processing apparatus according to one embodiment of the present invention.

FIG. 1 is a schematic cross sectional view of the substrate processing apparatus according to one embodiment of the present invention. In FIG. 1, the substrate processing apparatus 100 is a rotary substrate processing apparatus, and includes a rotation holder 10, a cup 20 for splash prevention, a nozzle unit (a nozzle) 30 and a controller 40. The rotation holder 10 is attached to a tip end of a rotation shaft 12 of a motor 11, and is driven to be rotated about a vertical axis while holding a substrate W in a horizontal attitude. In the present embodiment, a diameter of the substrate W is 300 mm, for example.

The cup 20 is provided to surround the substrate W held by the rotation holder 10. An opening 21 is formed on the upper surface side of the cup 20, and a liquid discard port 22 and a plurality of gas discharge ports 23 are formed at lower portions of the cup 20. The gas discharge ports 23 are connected to a gas discharge system in a factory. A current plate 24 is arranged below the rotation holder 10. This current plate 24 has an inclined surface inclined obliquely downward towards an outer periphery.

The nozzle unit 30 includes a resist nozzle 31, two solvent nozzles 32, 33, an edge rinse nozzle 34, back rinse nozzles 35 and a nozzle cleaning device (a nozzle cleaner) 36. Each of the resist nozzle 31, the solvent nozzles 32, 33 and the edge rinse nozzle 34 is provided to be movable upward and downward, and movable between a position directly upward of the substrate W and a waiting position outside of the cup 20. The back rinse nozzles 35 are provided below the substrate W. In the example of FIG. 1, the nozzle unit 30 includes the two back rinse nozzles 35. The nozzle cleaning device 36 is configured to be capable of cleaning the solvent nozzle 33.

During substrate processing, the resist nozzle 31 and the solvent nozzle 32 are located substantially directly upward of a center portion of a surface to be processed of the substrate W. The edge rinse nozzle 34 is located directly upward of a peripheral portion of the surface to be processed of the substrate W. The solvent nozzle 33 is located directly upward of a portion closer to the center portion of the surface to be processed of the substrate W than the edge rinse nozzle 34.

The resist nozzle 31 is connected to a resist liquid supply source P1 via a resist liquid supply pipe T1. The resist liquid is stored in the resist liquid supply source P1. In the present embodiment, the resist liquid has high viscosity of 50 cP to 1000 cP. A valve V1 is inserted into the resist liquid supply pipe T1. The resist liquid is supplied to the resist nozzle 31 through the resist liquid supply pipe T1 from the resist liquid supply source P1 by opening of the valve V1. Thus, the resist liquid is discharged at the surface to be processed of the substrate W from the resist nozzle 31.

The solvent nozzle 32 is connected to a solvent supply source P2 via a solvent supply pipe T2. A solvent is stored in the solvent supply source P2. The solvent includes PGMEA (Propyleneglycol Monomethylether Acetate), PGME (Propyleneglycol Monomethyl Ether) or Cyclohexanone, for example. A valve V2 is inserted into the solvent supply pipe T2. The solvent is supplied to the solvent nozzle 32 through the solvent supply pipe T2 from the solvent supply source P2 by opening of the valve V2. Thus, the solvent is discharged at the surface to be processed of the substrate W from the solvent nozzle 32.

The solvent nozzle 33 is connected to a solvent supply source P3 via a solvent supply pipe T3. A solvent similar to the solvent stored in the solvent supply source P2 is stored in the solvent supply source P3. A valve V3 is inserted into the solvent supply pipe T3. The solvent is supplied to the solvent nozzle 33 through the solvent supply pipe T3 from the solvent supply source P3 by opening of the valve V3. Thus, the solvent is discharged at the surface to be processed of the substrate W from the solvent nozzle 33.

The edge rinse nozzle 34 is connected to an edge rinse liquid supply source P4 via an edge rinse liquid supply pipe T4. A rinse liquid made of a solvent similar to the solvent stored in the solvent supply source P2 (hereinafter referred to as an edge rinse liquid) is stored in the edge rinse liquid supply source P4. A valve V4 is inserted into the edge rinse liquid supply pipe T4. The edge rinse liquid is supplied to the edge rinse nozzle 34 through the edge rinse liquid supply pipe T4 from the edge rinse liquid supply source P4 by opening of the valve V4. Thus, the edge rinse liquid for removing a film of the resist liquid (hereinafter referred to as a resist film) is discharged at the peripheral portion of the surface to be processed of the substrate W from the edge rinse nozzle 34.

The back rinse nozzle 35 is connected to a back rinse liquid supply source P5 via a back rinse liquid supply pipe T5. A rinse liquid made of a solvent similar to the solvent stored in the solvent supply source P2 (hereinafter referred to as a back rinse liquid) is stored in the back rinse liquid supply source P5. A valve V5 is inserted into the back rinse liquid supply pipe T5. The back rinse liquid is supplied to the back rinse nozzle 35 through the back rinse liquid supply pipe T5 from the back rinse liquid supply source P5 by opening of the valve V5. Thus, the back rinse liquid for cleaning a back surface (a surface opposite to the surface to be processed) of the substrate W is discharged from the back rinse nozzle 35.

The resist nozzle 31 is provided in a vertical attitude such that a discharge port of the resist liquid is directed downward, and the solvent nozzle 32 is provided in a vertical attitude such that a discharge port of the solvent is directed downward. The solvent nozzle 33 is provided to be inclined such that a discharge port of the solvent is directed obliquely downward and outward, and the edge rinse nozzle 34 is provided to be inclined such that a discharge port of the edge rinse liquid is directed obliquely downward and outward. The back rinse nozzle 35 is provided in a vertical attitude such that a discharge port of the back rinse liquid is directed upward.

The controller 40 controls a rotation speed of the motor 11 by supplying a rotation signal S0 to the motor 11. Thus, the rotation speed of the substrate W held by the rotation holder 10 is controlled. Further, the controller 40 controls opening and closing of the valves V1 to V5 by respectively supplying a resist liquid discharge signal S1, solvent discharge signals S2, S3, an edge rinse liquid discharge signal S4 and a back rinse liquid discharge signal S5 to the valves V1 to V5. Thus, timing for discharging the resist liquid, the solvent, the edge rinse liquid and the back rinse liquid is controlled.

(2) Substrate Processing

Figure 2:
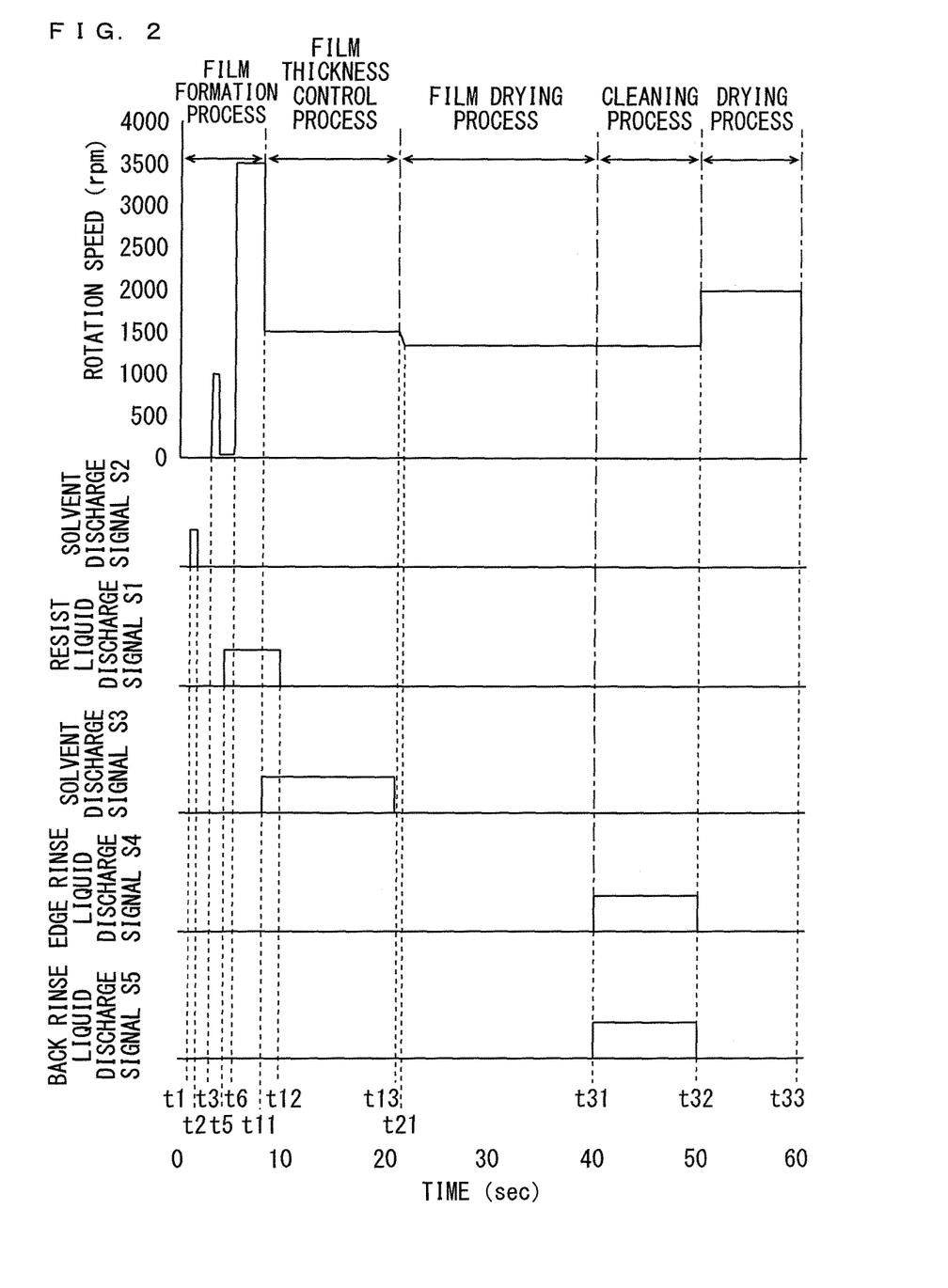
FIG. 2 is a diagram showing a change of a rotation speed of a substrate and a change of each signal in the substrate processing apparatus.

Processes for the substrate W in the substrate processing apparatus 100 of FIG. 1 will be described. FIG. 2 is a diagram showing the change of the rotation speed of the substrate W and the change of each signal S1 to S5 in the substrate processing apparatus 100. In FIG. 2, for each low level signal S1 to S5, each corresponding valve V1 to V5 is closed. For each high level signal S1 to S5, each corresponding valve V1 to V5 is opened.

As shown in FIG. 2, processes for the substrate W include a film formation process, a film thickness control process, a film drying process, a cleaning process and a drying process. In the film formation process, the resist liquid is applied to the surface to be processed of the substrate W. In the film thickness control process, control of the distribution and thickness of the resist film on the entire surface to be processed of the substrate W is performed. In the film drying process, selection of the thickness of the resist film is performed. In the cleaning process, cleaning for the peripheral portion of the surface to be processed and the back surface of the substrate W is performed. In the drying process, drying for the substrate W is performed.

The substrate W is held by the rotation holder 10 with the surface to be processed being directed upward (see FIG. 1). In an initial state, the rotation of the substrate W is stopped, and each signal S1 to S5 is a low level signal. In the film formation process, the solvent nozzle 32 is first moved from a waiting section (a waiting space) to a position directly upward of the center portion of the substrate W. The solvent discharge signal S2 becomes a high level signal at a time point t1. Thus, the solvent is discharged at the center portion of the surface to be processed of the substrate W from the solvent nozzle 32.

Next, the solvent discharge signal S2 becomes a low level signal at a time point t2. Thus, the discharge of the solvent from the solvent nozzle 32 is stopped. The rotation of the substrate W is started at a time point t3. Thus, the solvent discharged at the center portion of the surface to be processed of the substrate W diffuses to the entire surface to be processed of the substrate W by a centrifugal force resulting from the rotation of the substrate W.

Subsequently, the resist nozzle 31 is moved to a position directly upward of the center portion of the substrate W. The resist liquid discharge signal S1 becomes a high level signal at a time point t5. Thus, the resist liquid is discharged at the center portion of the surface to be processed of the substrate W from the resist nozzle 31. The rotation speed of the substrate W increases at a time point t6. The resist liquid discharged at the center portion of the surface to be processed of the substrate W diffuses to the entire surface to be processed of the substrate W by a centrifugal force resulting from the rotation of the substrate W. The resist liquid discharge signal S1 becomes a low level signal at a time point t12. Thus, the discharge of the resist liquid from the resist nozzle 31 is stopped. In the present example, the time point t12 is a time point later than a starting time point t11 of the film thickness control process.

In the film thickness control process, the solvent nozzle 33 is moved to the peripheral portion of the substrate W. The rotation speed of the substrate W decreases at the time point t11, and the solvent discharge signal S3 becomes a high level signal. The solvent nozzle 33 is moved at a relatively high speed in a direction moving towards the center portion of the substrate W while discharging the solvent. After moving inward from the peripheral portion of the substrate W to a predetermined position, the solvent nozzle 33 is moved at a relatively slow speed in a direction moving towards the peripheral portion of the substrate W while discharging the solvent.

Thus, after a supply position of the solvent is moved at a relatively high speed from an outer edge to an inner edge of an annular region at the peripheral portion of the substrate W, the supply position of the solvent is moved at a relatively low speed from the inner edge to the outer edge of the annular region at the peripheral portion of the substrate W. The supply position of the solvent refers to a position at which the solvent discharged from the solvent nozzle 33 reaches the surface to be processed of the substrate W. The solvent discharge signal S3 becomes a low level signal at a time point t13.

In the film thickness control process, fluidity of the resist liquid applied to the surface to be processed of the substrate W is maintained. Therefore, it is possible to control the diffusion of the resist liquid on the substrate W and control the distribution and thickness of the resist liquid on the entire surface to be processed of the substrate W by adjusting the position of the inner edge of the annular region and the moving speed of the solvent nozzle 33. A state in which fluidity of the resist liquid is maintained refers to a state in which the resist liquid is not completely dried, and the resist liquid is movable on the substrate W. Details of the film formation process and the film thickness control process will be described below.

In the film drying process, the rotation speed of the substrate W decreases to about 1300 rpm, for example, at a time point t21. The rotation of the substrate W is maintained for a constant time period in this state, whereby fluidity of the resist liquid applied to the substrate W is lost, and the thickness of the resist film is selected. A state in which fluidity of the resist liquid is lost refers to a state in which the resist liquid does not move on the substrate W.

In the cleaning process, the edge rinse nozzle 34 is moved to the peripheral portion of the substrate W. At a time point t31, the edge rinse liquid discharge signal S4 and the back rinse liquid discharge signal S5 become high level signals. Thus, the edge rinse liquid is discharged at the peripheral portion of the surface to be processed of the substrate W from the edge rinse nozzle 34, and the back rinse liquid is discharged at the back surface of the substrate W from the back rinse nozzle 35. Thus, the peripheral portion of the surface to be processed of the substrate W is cleaned by the edge rinse liquid, and the back surface of the substrate W is cleaned by the back rinse liquid.

Then, the rotation speed of the substrate W increases to 2000 rpm, for example, at a time point t32, and the edge rinse liquid discharge signal S4 and the back rinse liquid discharge signal S5 become low level signals. Thus, the discharge of the back rinse liquid and the discharge of the edge rinse liquid are stopped.

In the drying process, the edge rinse liquid and the back rinse liquid adhering to the substrate W are shaken off and removed from the substrate W. Thereafter, the rotation of the substrate W is stopped at a time point t33. Thus, a series of processes in the substrate processing apparatus 100 ends.

While the discharge of the edge rinse liquid and the discharge of the back rinse liquid are simultaneously started at a time point t31 in the example of FIG. 2, the present invention is not limited to this. Either the edge rinse liquid or the back rinse liquid may be discharged first. Similarly, in the example of FIG. 2, the edge rinse liquid and the back rinse liquid are simultaneously discharged at a time point t32. However, the present invention is not limited to this. Discharge of either the edge rinse liquid or the back rinse liquid may be stopped first.

(3) Film Formation Process and Film Thickness Control Process

Figure 3:
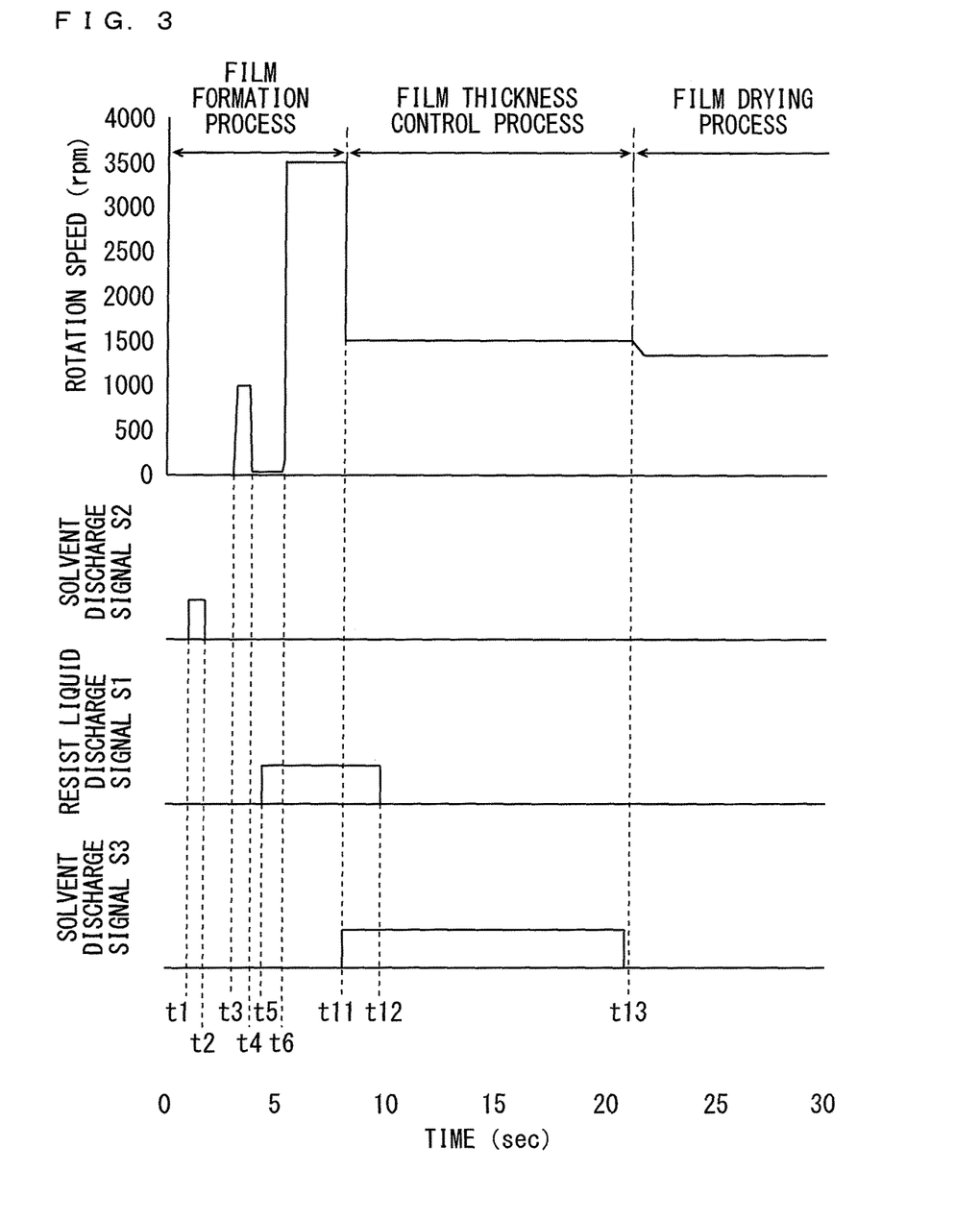
FIG. 3 is a diagram showing a change of the rotation speed of the substrate and a change of each signal in a film formation process and a film thickness control process.

Details of the film formation process and the film thickness control process, described above, will be described. FIG. 3 is a diagram showing the change of the rotation speed of the substrate W and the change of each signal S1 to S3 in the film formation process and the film thickness control process. FIGS. 4A to 4E are diagrams showing steps of adjusting the thickness of the resist liquid on the surface to be processed of the substrate W.

As described above, in the film formation process, after the solvent is discharged at the substrate W from the solvent nozzle 32 in a period from the time point t1 to the time point t2, the rotation of the substrate W is started at the time point t3. In this case, the rotation speed of the substrate W increases to 1000 rpm, for example. Thus, the solvent discharged at the substrate W diffuses outward in a radial direction of the surface to be processed of the substrate W.

In this manner, pre-wet processing for applying the solvent to the entire surface to be processed of the substrate W is performed. Thus, when the resist liquid is subsequently applied to the surface to be processed of the substrate W, the resist liquid is easy to diffuse on the surface to be processed of the substrate W. As a result, a film of the resist liquid can be formed on the substrate W with a smaller amount of the resist liquid. The rotation speed of the substrate W starts to decrease at the time point t4, and becomes 100 rpm, for example, after a constant time period.

After the solvent is applied to the entire surface to be processed of the substrate W, the resist liquid discharge signal S1 becomes a high level signal at the time point t5. Thus, the resist liquid is discharged at the center portion of the surface to be processed of the substrate W from the resist nozzle 31. Thereafter, the rotation speed of the substrate W increases to 3500 rpm, for example, at the time point t6. Thus, the resist liquid discharged at the substrate W diffuses outward in the radial direction of the surface to be processed of the substrate W (see FIG. 4A).

Then, in the film thickness control process, the solvent nozzle 33 is moved to the peripheral portion of the substrate W. At the time point t11, the rotation speed of the substrate W decreases to 1500 rpm, for example, and the solvent discharge signal S3 becomes a high level signal. Thus, the solvent is discharged from the solvent nozzle 33. Thereafter, at the time point t12, the resist liquid discharge signal S1 becomes a low level signal, and the discharge of the resist liquid is stopped. In this manner, in the present embodiment, a period during which the resist liquid is discharged from the resist nozzle 31 and a period during which the solvent is discharged from the solvent nozzle 33 partially overlap with each other. At the time point t13, the solvent discharge signal S3 becomes a low level signal, and the discharge of the solvent is stopped.

Figure 4A:
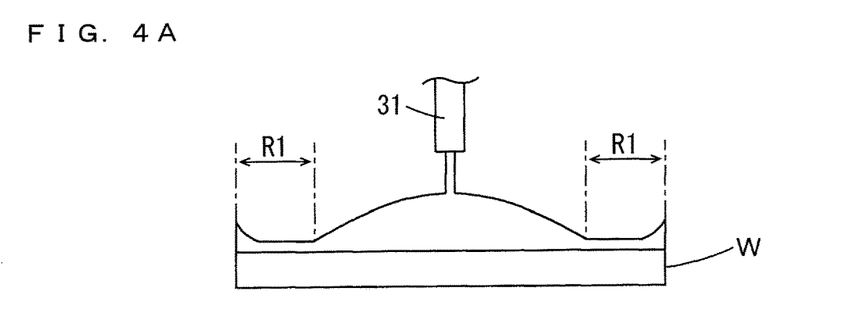
FIGS. 4A to 4E are diagrams showing steps of adjusting the thickness of a resist liquid on a surface to be processed of the substrate.
Figure 4B:
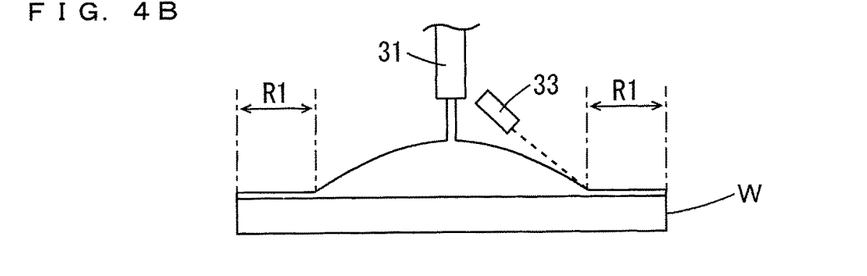

From the time point t11 to the time point t13, the solvent nozzle 33 is moved at a relatively high speed from the outer edge to the inner edge of the annular region R1 at the peripheral portion of the substrate W while discharging the solvent (see FIG. 4B). A moving time period of the solvent nozzle 33 from the outer edge to the inner edge of the annular region R1 is 1 second, for example. Thereafter, the solvent nozzle 33 is moved at a relatively low speed from the inner edge to the outer edge of the annular region R1 at the peripheral portion of the substrate W while discharging the solvent (see FIGS. 4C and 4D). The moving time period of the solvent nozzle 33 from the inner edge to the outer edge of the annular region R1 is 10 seconds, for example. The width of the annular region R1 in the radial direction is from 10 mm to 20 mm, for example.

Figure 4C:
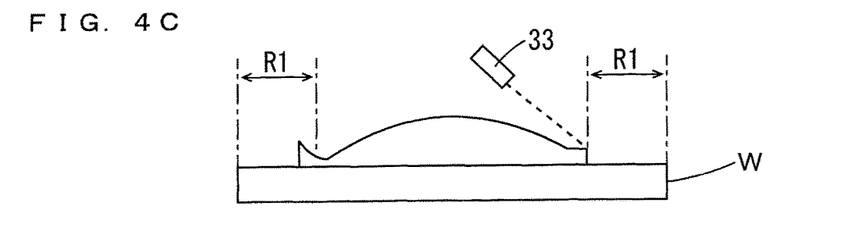
Figure 4D:
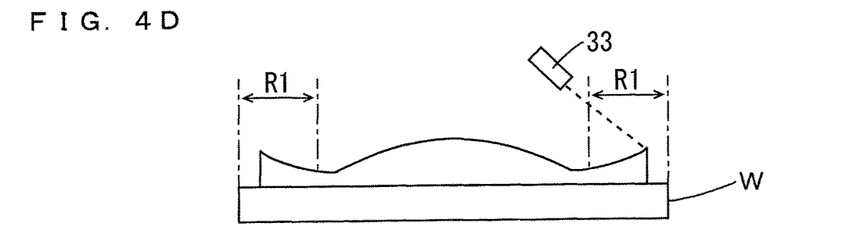

The resist liquid applied to the substrate W does not spread uniformly. Therefore, in the case where viscosity of the resist liquid is high, and a discharge amount of the resist liquid is small, the thickness of the resist liquid at the center portion of the substrate W increases the most, and the thickness of the resist liquid at the peripheral portion of the substrate W slightly increases, as shown in FIG. 4A. On the one hand, the thickness of the resist liquid of a portion between the center portion and the peripheral portion of the substrate W decreases. As shown in FIGS. 4B to 4D, the solvent is discharged from the inner edge to the outer edge of the annular region R1 before fluidity of the resist liquid is lost.

Figure 4E:
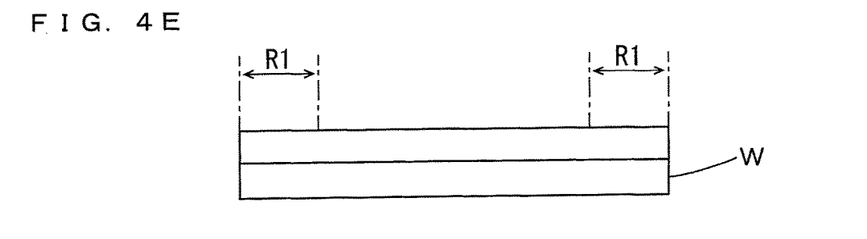

In this case, the resist liquid applied from the inner edge to the outer edge of the annular region R1 is removed, and drying proceeds while the resist liquid accumulated at the center portion of the substrate W is led to the peripheral portion. Thus, the thickness of the resist liquid at the center portion of the substrate W decreases, and the thickness of the resist liquid at the peripheral portion of the substrate W increases. As a result, as shown in FIG. 4E, the thickness of the resist liquid can be made close to being uniform. Further, the thickness of the entire resist liquid can be controlled by adjustment of the width of the annular region R1 in the radial direction and the moving speed of the solvent nozzle 33.

Figure 5A:
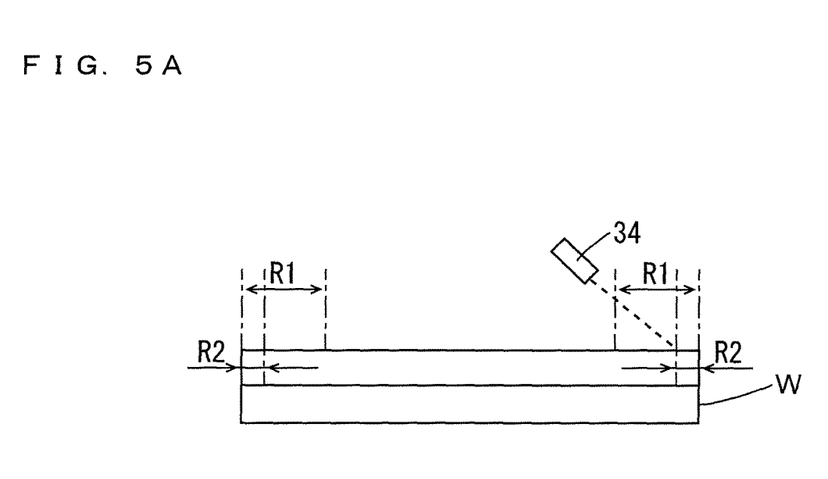
FIGS. 5A and 5B are diagrams showing steps of cleaning the substrate in a cleaning process.
Figure 5B:
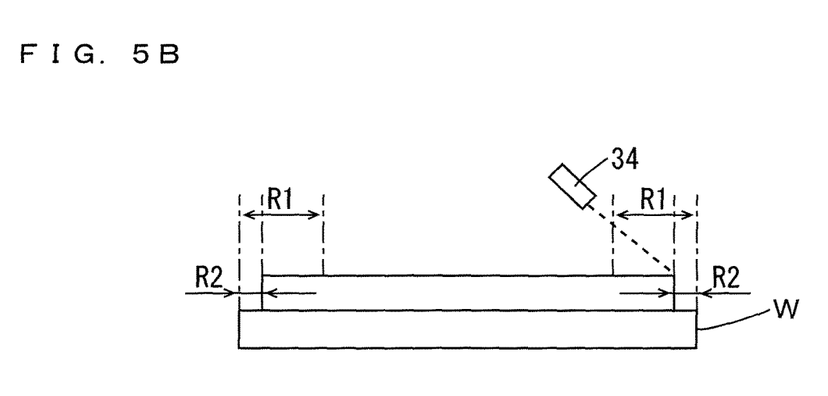

After the film thickness control process, the film drying process, the cleaning process and the drying process of FIG. 2 are sequentially performed. FIGS. 5A and 5B are diagrams showing the steps of cleaning the substrate W in the cleaning process. In FIGS. 5A and 5B, the cleaning processing for the back surface of the substrate W using the back rinse nozzle 35 is not shown or described.

As shown in FIG. 5A, in the cleaning process, the edge rinse liquid is discharged at an annular region R2 at the peripheral portion of the rotating substrate W from the edge rinse nozzle 34 after fluidity of the resist liquid is lost. Thus, as shown in FIG. 5B, the resist liquid of the annular region R2 is removed, and the annular region R2 is cleaned. In this manner, the film of the resist liquid is not formed in the annular region R2 at the peripheral portion of the substrate W. Thus, even in the case where a transport mechanism (a transport robot) (not shown) that transports the substrate W holds the peripheral portion of the substrate W, the resist film is prevented from being stripped and becoming particles.

An inner edge of the annular region R2 is located at a position further outward than the inner edge of the annular region R1. In the present embodiment, an outer edge of the annular region R2 overlaps with the outer edge of the annular region R1, and the width of the annular region R2 in the radial direction is smaller than the width of the annular region R1 in the radial direction. The width of the annular region R2 in the radial direction is 1 mm to 2 mm, for example. In this configuration, a formation region of the resist film on the substrate W is hardly reduced. Thus, a region of the substrate W that can be utilized for fabrication of a product can be increased.

(4) Inventive Example

In the inventive example, the resist film having a uniform thickness was formed on the substrate W by sequential performance of the film formation process, the film thickness control process, the film drying process, the cleaning process and the drying process that were shown in FIG. 2. On the one hand, in a comparative example, the film thickness control process was not performed, but the film formation process, the film drying process, the cleaning process and the drying process were sequentially performed, whereby the resist film having a uniform thickness was formed on the substrate W. As a result of comparison of an amount of the resist liquid to be used between the inventive example and the comparative example, it was found that, in the inventive example, the amount of the resist liquid to be used decreased by 40% from the amount of the resist liquid to be used in the comparative example.

(5) Effects

In the substrate processing apparatus 100 according to the present embodiment, the solvent is discharged from the inner edge to the outer edge of the annular region R1 by the solvent nozzle 33 before the resist liquid supplied to the surface to be processed of the substrate W by the resist nozzle 31 loses fluidity. In this case, the resist liquid supplied from the inner edge to the outer edge of the annular region R1 is removed, and drying proceeds while the resist liquid accumulated at the center portion of the substrate W is led to the peripheral portion. Thus, the thickness of the resist liquid at the center portion of the substrate W decreases, and the thickness of the resist liquid at the peripheral portion of the substrate W increases. Therefore, the thickness of the resist liquid can be made close to being uniform. As a result, the amount of the resist liquid to be used can be reduced with no occurrence of non-uniform application, missing application and non-uniform thickness of the film.

Further, in the present embodiment, after the supply position of the solvent is moved from the outer edge to the inner edge of the annular region R1, the solvent nozzle 33 is controlled such that the supply position of the solvent is moved from the inner edge to the outer edge of the annular region R1. Thus, an amount of splash of the solvent is reduced more sufficiently than the case where the supply position in the case of the start of supply of the solvent is at the inner edge of the annular region R1. Thus, contamination of the solvent nozzle 33 due to splash of the solvent can be reduced.

The moving speed of the supply position of the solvent from the outer edge towards the inner edge of the annular region R1 is larger than the moving speed of the supply position of the solvent from the inner edge towards the outer edge of the annular region R1. Therefore, the resist liquid supplied from the inner edge to the outer edge of the annular region R1 is sufficiently removed before the resist liquid loses fluidity. Further, because the supply position of the solvent is moved at a low speed from the inner edge to the outer edge of the annular region R1, the resist liquid accumulated at the center portion of the substrate W is sufficiently led to the peripheral portion without exceeding a diffusion speed of the resist liquid.

Further, in the present embodiment, a period during which the resist liquid is supplied to the one surface of the substrate W by the resist nozzle 31, and a period during which the solvent is supplied to the annular region R1 at the peripheral portion of the substrate W by the solvent nozzle 33 partially overlap with each other. In this case, the resist liquid supplied from the inner edge to the outer edge of the annular region R1 is sufficiently removed before the resist liquid loses fluidity. Thereafter, the resist liquid accumulated at the center portion of the substrate W is sufficiently led to the peripheral portion, whereby the thickness of the resist liquid can be efficiently made close to being uniform.

Further, in the present embodiment, because the solvent nozzle 33 supplies the solvent to the annular region R1 while discharging the solvent obliquely downward and outward, an amount of splash of the solvent is reduced more sufficiently than the case where the solvent is discharged directly downward. Therefore, contamination of the solvent nozzle 33 due to splash of the solvent can be reduced. Further, even in the case where the solvent nozzle 33 is contaminated, the solvent nozzle 33 is cleaned by the nozzle cleaning device 36. Thus, the solvent nozzle 33 can be maintained clean.

(6) Other Embodiments (a) While the solvent nozzle 33 and the edge rinse nozzle 34 are separately provided in the above-mentioned embodiment, the present invention is not limited to this. The solvent nozzle 33 and the edge rinse nozzle 34 may be constituted by a common nozzle.

Figure 6:
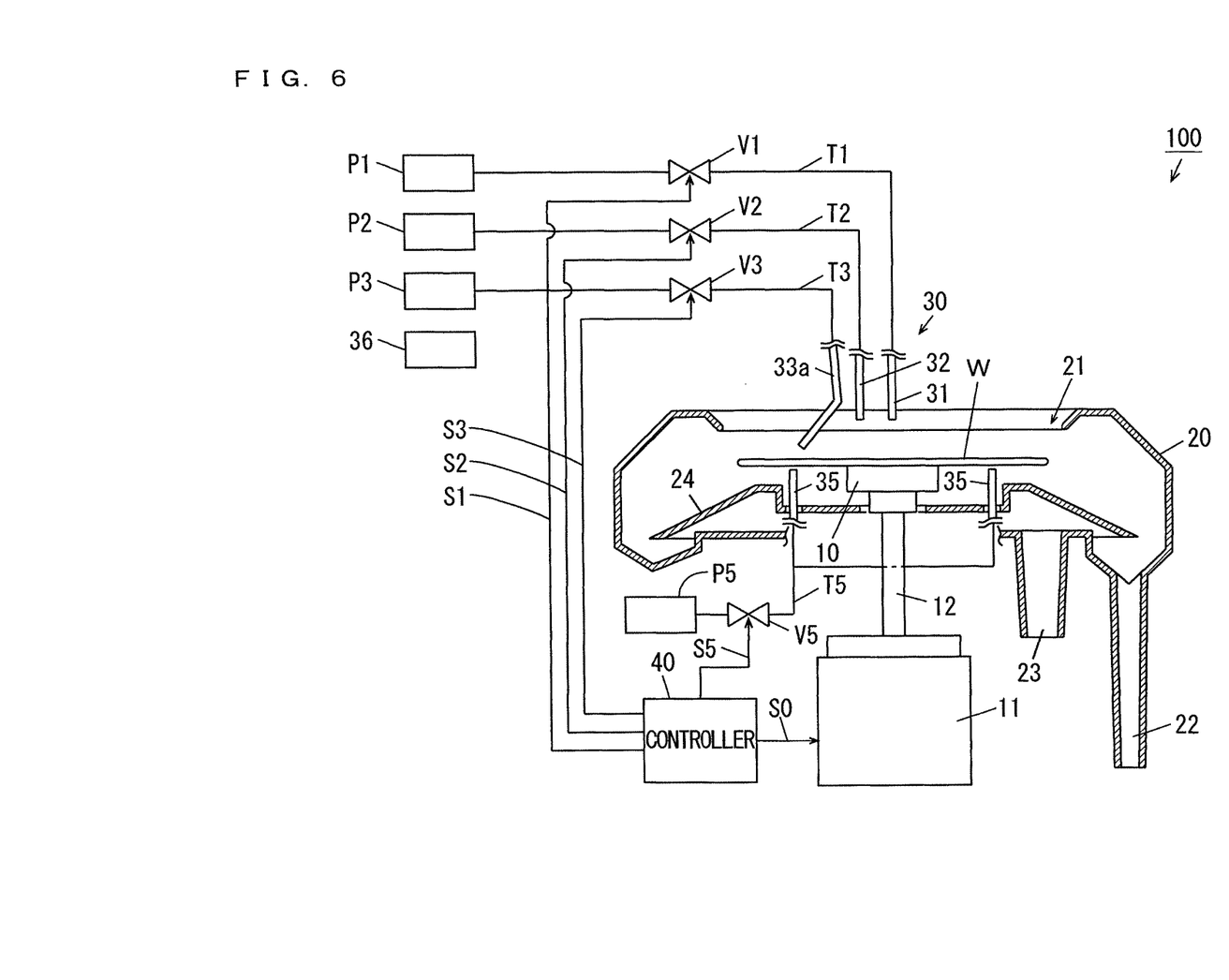
FIG. 6 is a schematic cross sectional view of the substrate processing apparatus according to another embodiment.

FIG. 6 is a schematic cross sectional view of the substrate processing apparatus 100 according to another embodiment. In the substrate processing apparatus 100 of FIG. 6, the edge rinse nozzle 34, the edge rinse liquid supply pipe T4, the valve V4 and the edge rinse liquid supply source P4 are not provided. Further, a solvent nozzle 33a is provided instead of the solvent nozzle 33. In the substrate processing apparatus 100 of FIG. 6, the same removal liquid is used as the solvent and the edge rinse liquid.

The solvent nozzle 33a performs an operation similar to the solvent nozzle 33 of FIG. 1 in the film thickness control process, and performs an operation similar to the edge rinse nozzle 34 of FIG. 1 in the cleaning process. In this case, because it is not necessary to separately provide the solvent nozzle 33 and the edge rinse nozzle 34, the substrate processing apparatus 100 can be made compact.

Figure 7:
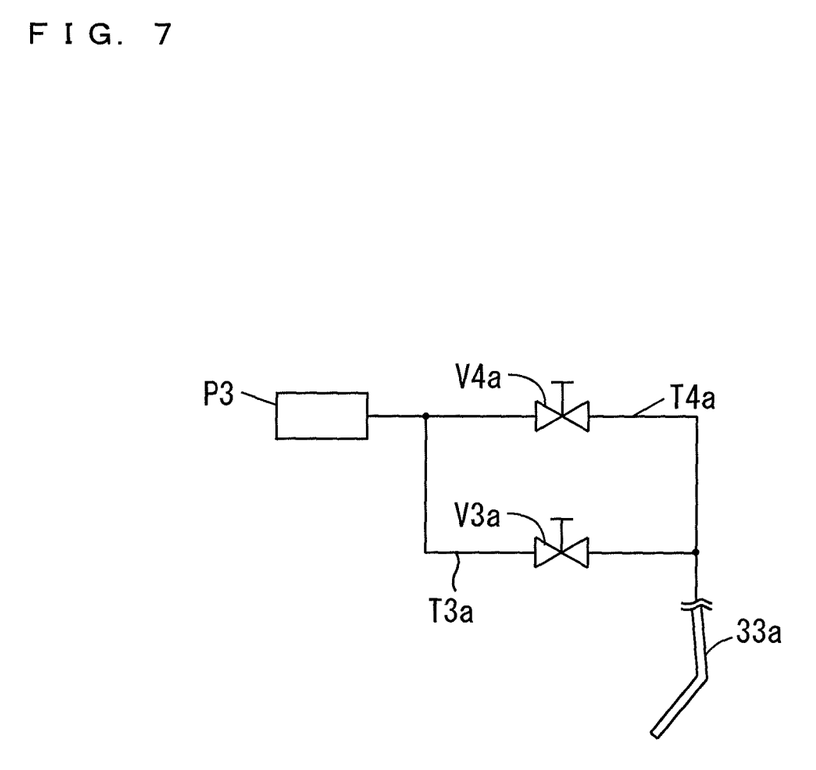
FIG. 7 is a schematic diagram for explaining a modified example of a solvent supply pipe between a solvent supply source and a solvent nozzle.

FIG. 7 is a schematic diagram for explaining a modified example of a solvent supply pipe between the solvent supply source P3 and the solvent nozzle 33a. As shown in FIG. 7, the solvent nozzle 33a is connected to the solvent supply source P3 via two solvent supply pipes T3a, T4a. Valves V3a, V4a are inserted into the solvent supply pipes T3a, T4a, respectively. The valves V3a, V4a are needle valves, for example, and can perform subtle adjustment of a flow amount of the fluid flowing through the solvent supply pipes T3a, T4a.

In the example of FIG. 7, when the solvent is supplied to the annular region R1 of the substrate W from the solvent nozzle 33a in the film thickness control process, the valve V3a is opened, and the valve V4a is closed. When the solvent used as the edge rinse liquid is supplied to the annular region R2 of the substrate W from the solvent nozzle 33a in the cleaning process, the valve V4a is opened, and the valve V3a is closed.

A flow amount of the solvent flowing through the solvent supply pipe T3a when the valve V3a is opened may be larger than a flow amount of the solvent flowing through the solvent supply pipe T4a when the valve V4a is opened. In the present example, a flow amount of the solvent flowing through the solvent supply pipe T3a when the valve V3a is opened is 30 ml/min, for example, and a flow amount of the solvent flowing through the solvent supply pipe T4a when the valve V4a is opened is 15 ml/min, for example.

In this configuration, a path of the solvent supply pipe for supplying the solvent in the film thickness control process and a path of the solvent supply pipe for supplying the edge rinse liquid in the cleaning process are switched. A supply amount of the solvent in the film thickness control process is larger than the supply amount of the solvent in the cleaning process. Thus, more uniform film thickness control can be performed on the entire circumference of the substrate W.

While the same removal liquid is used as the solvent and the edge rinse liquid in the present embodiment, the present invention is not limited to this. A separate removal liquid may be used as the solvent and the edge rinse liquid. In this case, the solvent is discharged from the solvent nozzle 33a in the film thickness control process, and the edge rinse liquid is discharged from the solvent nozzle 33a in the cleaning process.

(b) While the moving speed of the supply position of the solvent from the outer edge towards the inner edge of the annular region R1 is preferably larger than the moving speed of the supply position of the solvent from the inner edge towards the outer edge of the annular region R1 in the above-mentioned embodiment, the present invention is not limited to this. The moving speed of the supply position of the solvent from the outer edge towards the inner edge of the annular region R1 may be equal to the moving speed of the supply position of the solvent from the inner edge towards the outer edge of the annular region R1. Alternatively, the moving speed of the supply position of the solvent from the outer edge towards the inner edge of the annular region R1 may be smaller than the moving speed of the supply position of the solvent from the inner edge towards the outer edge of the annular region R1.

(c) In the above-mentioned embodiment, the supply position of the solvent is preferably at the outer edge of the annular region R1 at the start time point t11 of the film thickness control process, and is preferably moved from the inner edge to the outer edge after being moved from the outer edge to the inner edge of the annular region R1. However, the present invention is not limited to this. The supply position of the solvent may be at the inner edge of the annular region R1 at the start time point t11 of the film thickness control process, and the supply position of the solvent may be moved from the inner edge to the outer edge of the annular region R1.

(d) While it is preferable that a period during which the resist liquid is supplied to the surface to be processed of the substrate W by the resist nozzle 31 partially overlaps with a period during which the solvent is supplied to the annular region R1 of the substrate W by the solvent nozzle 33 in the above-mentioned embodiment, the present invention is not limited to this. The period during which the resist liquid is supplied to the surface to be processed of the substrate W by the resist nozzle 31 and the period during which the solvent is supplied to the annular region R1 of the substrate W by the solvent nozzle 33 do not have to overlap with each other. In this case, the resist liquid is supplied to the surface to be processed of the substrate W by the resist nozzle 31, and the solvent is supplied to the annular region R1 of the substrate W by the solvent nozzle 33 after supply of the resist liquid is stopped.

(e) While the solvent nozzle 33 is preferably provided with the discharge port of the solvent being inclined obliquely downward and outward in the above-mentioned embodiment, the present invention is not limited to this. The solvent nozzle 33 may be provided in a vertical attitude such that the discharge port of the solvent is directed downward.

Similarly, in the above-mentioned embodiment, the edge rinse nozzle 34 is preferably provided with the discharge port of the edge rinse liquid being directed obliquely downward and outward. However, the present invention is not limited to this. The edge rinse nozzle 34 may be provided in a vertical attitude such that the discharge port of the edge rinse liquid is directed downward.

(f) While the nozzle cleaning device 36 is preferably provided in the substrate processing apparatus 100 in the above-mentioned embodiment, the present invention is not limited to this. The nozzle cleaning device 36 does not have to be provided in the substrate processing apparatus 100.

(g) While the solvent is preferably supplied to the surface to be processed of the substrate W by the solvent nozzle 32 before the resist liquid is supplied to the surface to be processed of the substrate W by the resist nozzle 31 in the film formation process in the above-mentioned embodiment, the present invention is not limited to this. The solvent does not have to be supplied to the surface to be processed of the substrate W by the solvent nozzle 32 before the resist liquid is supplied to the surface to be processed of the substrate W by the resist nozzle 31 in the film formation process. In this case, the solvent nozzle 32, the valve V2, the solvent supply pipe T2 and the solvent supply source P2 do not have to be provided in the nozzle unit 30.

(h) While the edge rinse liquid is discharged at the annular region R2 at the peripheral portion of the rotating substrate W from the edge rinse nozzle 34 in the cleaning process in the above-mentioned embodiment, the present invention is not limited to this. In the case where it is not necessary to remove the resist liquid at the annular region R2, the edge rinse liquid does not have to be discharged at the annular region R2 at the peripheral portion of the rotating substrate W from the edge rinse nozzle 34 in the cleaning process. In this case, the edge rinse nozzle 34, the valve V4, the edge rinse liquid supply pipe T4 and the edge rinse liquid supply source P4 do not have to be provided in the nozzle unit 30.

(i) While the solvent supply source P2, the solvent supply source P3, the edge rinse liquid supply source P4 and the back rinse liquid supply source P5 are separately provided in the above-mentioned embodiment, the present invention is not limited to this. In the case where part or all of the solvent, the edge rinse liquid and the back rinse liquid are the same processing liquid, part or all of the solvent supply source P2, the solvent supply source P3, the edge rinse liquid supply source P4 and the back rinse liquid supply source P5 may be integrally provided. In this case, because it is not necessary to prepare a large number of types of processing liquids, a cost of the substrate processing apparatus 100 can be reduced.

(j) While the rotation speed of the substrate W in the film drying process is smaller than the rotation speed of the substrate W in the film thickness control process in the above-mentioned embodiment, the present invention is not limited to this. The rotation speed of the substrate W in the film drying process may be equal to the rotation speed of the substrate W in the film thickness control process. Alternatively, the rotation speed of the substrate W in the film drying process may be larger than the rotation speed of the substrate W in the film thickness control process.

(7) Correspondences Between Constituent Elements in Claims and Parts in Preferred Embodiments In the following paragraphs, non-limiting examples of correspondences between various elements recited in the claims below and those described above with respect to various preferred embodiments of the present invention are explained.

In the above-mentioned embodiment, the substrate W is an example of a substrate, the substrate processing apparatus 100 is an example of a substrate processing apparatus, the rotation holder 10 is an example of a rotation holder, and the resist nozzle 31 is an example of a coating liquid supplier. The solvent nozzle 33 and the edge rinse nozzle 34 are examples of first and second removal liquid suppliers, respectively, the controller 40 is an example of a controller, and the annular regions R1, R2 are examples of first and second annular regions, respectively. The nozzle cleaning device 36 is an example of a cleaner, and the solvent nozzle 32 is an example of a solvent supplier.

As each of constituent elements recited in the claims, various other elements having configurations or functions described in the claims can be also used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

INDUSTRIAL APPLICABILITY

The present invention can be effectively utilized for coating processing for various types of substrates.

We claim:

1. A substrate processing method for forming a film of a coating liquid on a substrate, including the steps of:
   holding and rotating the substrate in a horizontal attitude by a rotation holder;
   supplying the coating liquid by a coating liquid supplier to one surface of the substrate rotated by the rotation holder;
   removing the coating liquid in a first annular region at a peripheral portion of the substrate rotated by the rotation holder by a first removal liquid supplied by a first removal liquid supplier; and
   moving a supply position of the first removal liquid by the first removal liquid supplier from an inner edge to an outer edge of the first annular region, to cause the coating liquid accumulated at a center portion of the substrate to move to the peripheral portion of the substrate so that the moved coating liquid remains in the first annular region.

2. The substrate processing method according to claim 1, wherein
   the step of removing the coating liquid in the first annular region includes moving the supply position of the first removal liquid by the first removal liquid supplier from the outer edge to the inner edge of the first annular region.

3. The substrate processing method according to claim 2, wherein
   a moving speed of the supply position of the first removal liquid from the outer edge towards the inner edge of the first annular region is larger than a moving speed of the supply position of the first removal liquid from the inner edge towards the outer edge of the first annular region.

4. The substrate processing method according to claim 1, wherein
   a period during which the coating liquid is supplied to the one surface of the substrate by the coating liquid supplier and a period during which the first removal liquid is supplied to the first annular region at the peripheral portion of the substrate by the first removal liquid supplier partially overlap with each other.

5. The substrate processing method according to claim 1, wherein
   the first removal liquid supplier supplies the first removal liquid to the first annular region while discharging the first removal liquid obliquely downward and outward.

6. The substrate processing method according to claim 1, further including the step of supplying a second removal liquid by a second removal liquid supplier to a second annular region at the peripheral portion of the substrate rotated by the rotation holder after the coating liquid supplied by the coating liquid supplier loses fluidity, wherein
   an inner edge of the second annular region is located at a position further outward than the inner edge of the first annular region.

* * * * *